United States Patent
Shrivastava et al.

(10) Patent No.: US 8,120,439 B2
(45) Date of Patent: Feb. 21, 2012

(54) FAST START-UP CRYSTAL OSCILLATOR

(75) Inventors: Aatmesh Shrivastava, Muzzafarpur (IN); Rajesh Yadav, Ahmedabad (IN); Parvinder Kumar Rana, Ambala Cantt. (IN)

(73) Assignee: Texas Instruments Incorporated, Dallas, TX (US)

( * ) Notice: Subject to any disclaimer, the term of this patent is extended or adjusted under 35 U.S.C. 154(b) by 6 days.

(21) Appl. No.: 12/540,367

(22) Filed: Aug. 13, 2009

(65) Prior Publication Data

US 2011/0037527 A1 Feb. 17, 2011

(51) Int. Cl.
*H03B 5/32* (2006.01)
*H03L 5/00* (2006.01)

(52) U.S. Cl. .................. 331/160; 331/158; 331/183

(58) Field of Classification Search ................ 331/154, 331/158, 160, 182, 183
See application file for complete search history.

(56) References Cited

U.S. PATENT DOCUMENTS

| | | | | |
|---|---|---|---|---|
| 4,321,562 A * | 3/1982 | Igarashi | .................. | 331/116 FE |
| 4,513,255 A * | 4/1985 | Terbrack | ................... | 331/1 A |
| 5,162,746 A * | 11/1992 | Ghoshal | .................. | 327/159 |
| 5,184,094 A * | 2/1993 | Kohler | ....................... | 331/158 |
| 5,331,296 A * | 7/1994 | Davis | ........................... | 331/158 |
| 6,118,348 A * | 9/2000 | Narahara | ................. | 331/116 FE |
| 6,556,094 B2 * | 4/2003 | Hasegawa et al. | ............. | 331/158 |
| 7,030,709 B2 * | 4/2006 | Novac | ........................... | 331/158 |
| 7,138,881 B2 * | 11/2006 | Lin | .................. | 331/158 |
| 7,642,873 B2 * | 1/2010 | Sprouse | ....................... | 331/173 |
| 7,808,334 B2 * | 10/2010 | Yoshida et al. | ................. | 331/158 |
| 7,859,353 B2 * | 12/2010 | Liu et al. | ....................... | 331/160 |

* cited by examiner

*Primary Examiner* — Levi Gannon
(74) *Attorney, Agent, or Firm* — John R. Pessetto; W. James Brady; Frederick J. Telecky, Jr.

(57) ABSTRACT

An exemplary fast start-up crystal oscillator with reduced start-up time. The exemplary oscillator reduces the start-up time (i.e., the time taken to attain sustained stable oscillations after the power is turned on) by increasing the negative resistance of a circuit. Increasing the negative resistance increases the rate of growth of the oscillations, thereby reducing start-up time. The exemplary crystal oscillator includes a gain stage with negative resistance. A crystal with shunt capacitance is placed in the feedback loop of the gain stage. A buffer is coupled to the gain stage such that it blocks the crystal shunt capacitance from loading the gain stage, effectively increasing the negative resistance of the gain stage. Further, an oscillation detection and control circuit is coupled between the crystal and the gain stage. The oscillation detection and control circuit connects the buffer during start-up, and disconnects the buffer once an oscillation signal attains sustained stable oscillations.

14 Claims, 4 Drawing Sheets

FAST START-UP CRYSTAL OSCILLATOR

TECHNICAL FIELD

Embodiments of the present invention relate to crystal oscillators and more specifically to fast start-up crystal oscillators.

BACKGROUND

Most digital circuits use oscillators to provide clocking for synchronous digital devices. A wide range of oscillators, for different applications, are available that provide highly accurate and frequency-selective signals. One category of oscillators is crystal oscillators, which employ vibrating crystals to create electrical signals with very precise frequencies. These oscillators typically provide a stable clock signal to stabilize frequencies for radio transmitters/receivers and for digital integrated circuits.

Crystal oscillators commonly include an amplifier and a crystal in the amplifier's feedback loop. In certain applications, such as mobile phones, the crystal oscillator is frequently turned off when not in use, to save power. In these applications, it is essential that the crystal oscillator achieve stable oscillations quickly, every time it is powered back on.

A few techniques can be employed to reduce the start-up time of crystal oscillators (i.e., the time taken to attain sustained stable oscillations after the power is turned on). Some techniques attempt to reach the bias point of the amplifier quickly. One such method shorts the crystal during start-up, thereby allowing the amplifier to reach its bias point faster. Reaching the bias point faster ensures that oscillations start quickly but does not speed-up the stabilization of oscillations in any manner.

BRIEF SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

Embodiments of the invention are directed to an exemplary system and method for reducing the start-up time of crystal oscillators. The exemplary fast start-up crystal oscillator includes a gain stage with negative resistance. A crystal is operatively coupled in the feedback loop of the gain stage. The crystal includes a shunt capacitance. In addition, a buffer is coupled to the gain stage of the crystal oscillator such that the buffer can isolate the gain stage from the crystal shunt capacitance and effectively increase the negative resistance of the gain stage. An increase in the negative resistance increases the rate of growth of an oscillation signal in the oscillator, thereby reducing the start-up time.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations of the description that follows.

Overview

Figure 1A:
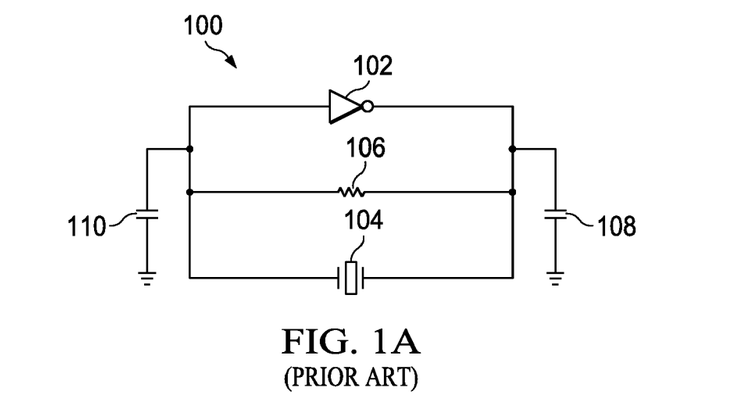
FIG. 1 depicts a typical crystal oscillator.
Figure 1B:
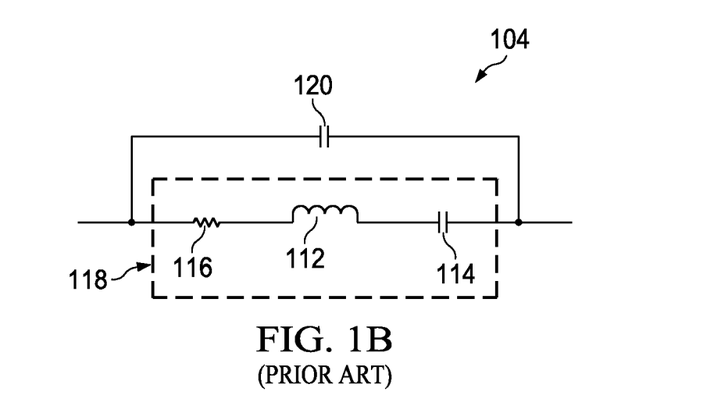

FIG. 1 includes FIG. 1(a) that depicts a typical crystal oscillator 100, together with FIG. 1(b) that depicts a well-known equivalent circuit diagram of a crystal. FIG. 1 is used to explain the operation of a typical crystal oscillator 100 to assist understanding the operation of the exemplary crystal oscillator of the claimed invention. The crystal oscillator 100 includes an amplifier 102 with a crystal 104 in a feedback loop. The amplifier 102 can be an inverting amplifier. A biasing resistor 106 is connected in parallel with the amplifier 102 for biasing the amplifier 102 in its negative resistance range. The crystal oscillator 100 further includes load capacitors 108 and 110. The value of the load capacitors 108 and 110 is inversely proportional to the resonance frequency of the crystal 104. Parallel load capacitors, however, have an almost negligible impact on the resonance frequency of the crystal, which is mostly determined by the crystal properties.

The equivalent circuit of the crystal 104 includes an inductor 112, a capacitor 114, and a resistor 116 connected in series. These components are referred to as the motional inductance, the motional capacitance and the effective series resistance (ESR) of the crystal, respectively, and are generally designated as motional impedance 118. The motional or vibrational characteristics of the crystal 104 determine the values of these basic frequency-determining components of the crystal 104.

A static shunt capacitor 120, representing the capacitive coupling between the electrodes of the crystal 104, is effectively connected in parallel with the series combination of the inductor 112, the capacitor 114, and the resistor 116. The shunt capacitor 120 value is determined by the size and spacing of the electrodes making contact with the crystal 104, by the capacitance of the wire leads connected to the electrodes, and by the capacitance of the crystal case and holder in which the crystal 104 is mounted. Generally, the shunt capacitor 120 is referred to as the static shunt capacitance of the crystal 104.

The circuit of FIG. 1(a) has a series resonant frequency at which the inductor 112 and the capacitor 114 are series resonant with each other, and a parallel resonant frequency slightly higher than the series resonant frequency. At the parallel resonant frequency, the shunt capacitor 120 is parallel resonant with the motional impedance 118 including the inductor 112 and the capacitor 114.

For sustained oscillations, the crystal oscillator 100 must satisfy three conditions known as the Barkhausen conditions. In brief, the conditions are positive feedback; unity loop gain; and 360° or 0° phase shift around the loop. The amplifier 102 provides the unity loop gain, while the crystal 104 provides positive feedback. The third condition is satisfied by all the devices in the crystal oscillator 100; the inverting amplifier 102 provides a 180° shift, while 90° phase shift is provided by the crystal 104. The shunt capacitor 120 and the biasing resistor 106 along with the load capacitors provide the remaining 90° phase shift. The operation of the typical crystal oscillator 100 is described in the following paragraphs.

The crystal oscillator 100 begins oscillating when a supply power is turned on. A small noise voltage present at the input of the amplifier 102 is amplified and provided to the crystal 104. The crystal 104 acts as a high quality notch filter attenuating all signals except the resonance frequency signals. The filtered signals are again provided to the input of the amplifier 102, where they are further amplified. This process continues until the oscillation signal reaches a threshold value, which is typically governed by a power supply voltage provided to the amplifier 102.

The voltage of the oscillation signal at any given time is given by equation 1

$$V(t)=f(L,C,C_{load},R,R0,t) \quad (1)$$

According to the equation, the oscillation signal amplitude (V) at any time is a function of the motional inductance (L), the motional capacitance (C), the load capacitance ($C_{load}$), the effective series resistance ESR (R), the negative resistance ($R_0$) of the amplifier 102, and time (t). Further, the ESR effectively attenuates the oscillation signal of the crystal oscillator 100, while the negative resistance of the amplifier compensates for the attenuation effects caused by the ESR. Thus, for an increasing oscillation signal, the negative resistance should be greater than the ESR. Typically, the inverting amplifier 102 is chosen such that its negative resistance is at least three times greater than the ESR. Further, as can be seen from the equation, for a given crystal, the value of the motional inductance, motional capacitance, load capacitance, and ESR is fixed, with the negative resistance being the only variable. Thus, selecting an appropriate negative resistance value can boost the rate of increase of the oscillation signal amplitude, thereby reducing the start-up time required for oscillations. Further, as the rate of increase of the oscillation signal amplitude is directly proportional to the negative resistance, increasing the negative resistance can reduce the start-up time considerably.

As a rule of thumb, the negative resistance should be at least three times greater than the ESR in order to build the oscillation signal. Thus, a novel crystal oscillator is introduced that can increase the negative resistance of the amplifier at start-up. The ESR varies for different crystal types. Conventionally, low-priced crystals have a higher ESR, while crystals that are more expensive have a lower ESR. As the ESR increases, the difference between the ESR and the amplifiers negative resistance decreases. Typically, in mobile applications, cheaper crystals are utilized to keep the cost of the mobile device as low as possible. As a result, in mobile devices, the start-up time is larger than in other applications where more expensive crystal oscillators may be implemented. In one embodiment, the present invention can be used in mobile devices to reduce the start-up time of the crystal oscillator. It will be appreciated by a person skilled in the art, that the exemplary crystal oscillator can be utilized for any crystal oscillator to reduce the start-up time, irrespective of the ESR value.

Exemplary Crystal Oscillator

Figure 2:
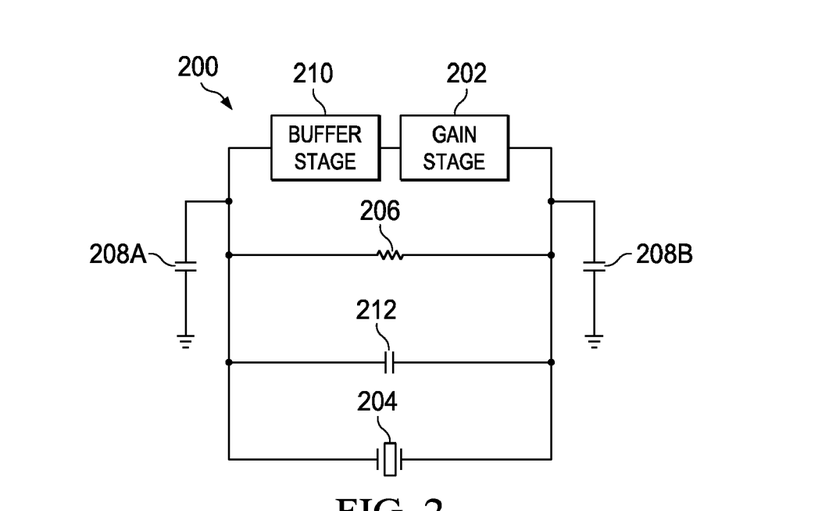
FIG. 2 depicts a block diagram of an exemplary fast start-up crystal oscillator.

FIG. 2 illustrates an exemplary fast start-up crystal oscillator 200 (referred to as crystal oscillator 200 hereinafter), which includes a gain stage 202, a crystal 204 in the feedback loop of the gain stage 202, a biasing resistor 206 that biases the gain stage 202, and load capacitors 208A and 208B. Further, the exemplary crystal oscillator 200 includes a buffer stage 210.

The gain stage 202 can be any active device that provides a gain (G) equal to or greater than one, provides a 180-degree phase shift, and has a negative resistance. In one embodiment, the gain stage 202 is an inverting operational amplifier. To allow the gain stage 202 to exhibit appropriate negative resistance, the biasing resistor 206 provides biasing. Further, the gain stage is biased by a power supply. The power supply dictates the maximum amplification provided by the gain stage 202. The amplitude of the amplified signal cannot exceed the full swing amplitude of the power supply. Any type of power supply can be employed depending on the amplification required, the type of gain stage, the type of crystal, application of the crystal oscillator, etc. A voltage or current power supply can be utilized, which can be positive and negative, positive and ground, or negative and ground.

Value of the load capacitors 208A and 208B should be specified for a particular application to ensure initial frequency tolerance. Load capacitance is generally the capacitance added to the crystal oscillator 200 when the crystal oscillator is connected to an external circuit. The crystal 204 moreover includes a shunt capacitance ($C_{shunt}$) as described previously. The shunt capacitance along with the load capacitors 208A and 208B ($C_{load1}$ and $C_{load2}$) can be combined into an equivalent capacitance ($C_{eq}$) represented as an equivalent capacitor 212 to depict a small signal model of the crystal oscillator 200. The equivalent capacitance ($C_{eq}$) can be provided by the following equation:

$$C_{eq}=C_{shunt}+C_{load1}\|C_{load2} \quad (2)$$

Further, the shunt capacitance at the input of the gain stage 202 attempts to reduce the negative resistance ($R_0$). This consequence is often termed as Miller effect, which is the effective multiplication of impedance across a negative gain device. According to the Miller effect, the effective shunt capacitance ($C_{effective}$) at the input of the inverting amplifier is then given by equation 3.

$$C_{effective}=C_{shunt}*(G+1) \quad (3)$$

Consequently, the effective shunt capacitance ($C_{effective}$) seen at the gain stage input is a product of the shunt capacitance and the inverting amplifier gain (G). Even if the gain stage 202 provides unity gain, the effective capacitance ($C_{effective}$) becomes double the shunt capacitance. Moreover, the negative resistance is inversely proportional to the shunt capacitance and the load capacitance. Accordingly, the lower the shunt capacitance in the circuit, the higher the amplifier negative resistance. Further, equation 1 shows the relationship between the negative resistance and the oscillation signal (V(t)) at a given time. Therefore, a lower shunt capacitance is required to boost the rate of increase of the oscillation signal amplitude.

To this end, the exemplary crystal oscillator 200 includes the buffer stage 210 connected to the input of the gain stage 202, which reduces the effects of the shunt capacitance on the negative resistance ($R_0$). The buffer stage 210 can isolate the shunt capacitance of the crystal from loading the gain stage input. This isolation causes an increase in the gain stage negative resistance, thereby decreasing the start-up time of the oscillation signal considerably.

Typically, a buffer provides electrical impedance transformation from one circuit to another, as the buffer inherently has very high input impedance and very low output impedance. In an ideal voltage buffer, the input resistance is infinite, and the output resistance is zero. Other ideal buffer properties are perfect linearity (regardless of signal amplitudes), and instant output response (regardless of the input signal speed). As the buffer has very high input impedance (about 1 MΩ to 10 TΩ), it does not load the source or draw any current from it. In addition, the buffer drives the circuit connected at its output as if it were a perfect voltage source due to the very low output impedance.

Any buffer known in the art can be used in the crystal oscillator 200. Buffer examples include operational amplifiers, single transistor circuits such as transistors in common-collector or common-drain configuration, integrated buffer amplifiers, vacuum tubes, and so on. In one implementation, a unity gain operational amplifier buffer is used. The unity gain operational amplifier buffer is also called a voltage follower amplifier, as the output voltage follows the input voltage. It has been observed that the unity gain operational amplifier buffer (hereon referred to as the unity gain buffer) provides the best results compared to other voltage buffers. It will be understood, however, that any other voltage buffer, such as an N-gain buffer can be substituted for the unity gain buffer without deviating from the teachings of the claimed invention.

Figure 3:
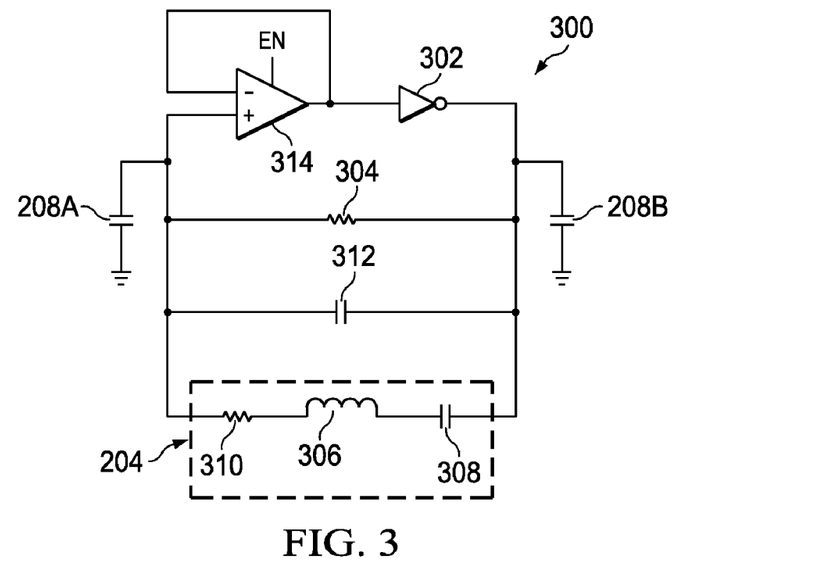
FIG. 3 depicts a circuit diagram of an exemplary fast start-up crystal oscillator.

FIG. 3 depicts a circuit diagram 300 of an exemplary crystal oscillator according to embodiments of the claimed invention. The circuit diagram 300 includes an inverting amplifier 302 biased by a biasing resistor 304, and the crystal 204 connected in the feedback loop of the inverting amplifier 302. In addition, the circuit diagram 300 includes an equivalent representation of the crystal 204, which includes a motional inductor 306, a motional capacitor 308, an effective series resistor 310, and a shunt capacitor 312. The exemplary oscillator further includes the load capacitors 208A and 208B. A unity gain buffer 314 is connected between the crystal 204 output and the inverting input of the inverting amplifier 302. The unity gain buffer 314 isolates the inverting amplifier from the loading effects of the shunt capacitance, thereby increasing the amplifier negative resistance, and considerably reducing the oscillator start-up time.

In one embodiment, the unity gain buffer 314 can be realized with an operational amplifier in a negative feedback configuration. Further, the operational amplifier has two stages, a differential amplifier stage, and a high gain push-pull amplifier stage. The differential amplifier provides amplification to the difference of the input signals, which can be positive and negative oscillation signals. The amplified differential signal is provided to the high gain push-pull amplifier, which employs two similar or equivalent amplifying devices working in opposite phases. The output of the differential amplifier is amplified in two amplifying devices, such as transistors, the amplified 180 phase shifted signals are combined, resulting an amplified, low noise signal. It will be understood that other configurations known in the art can be utilized instead, to realize the unity gain buffer 314 without departing from the scope of the claimed invention.

Figure 4:
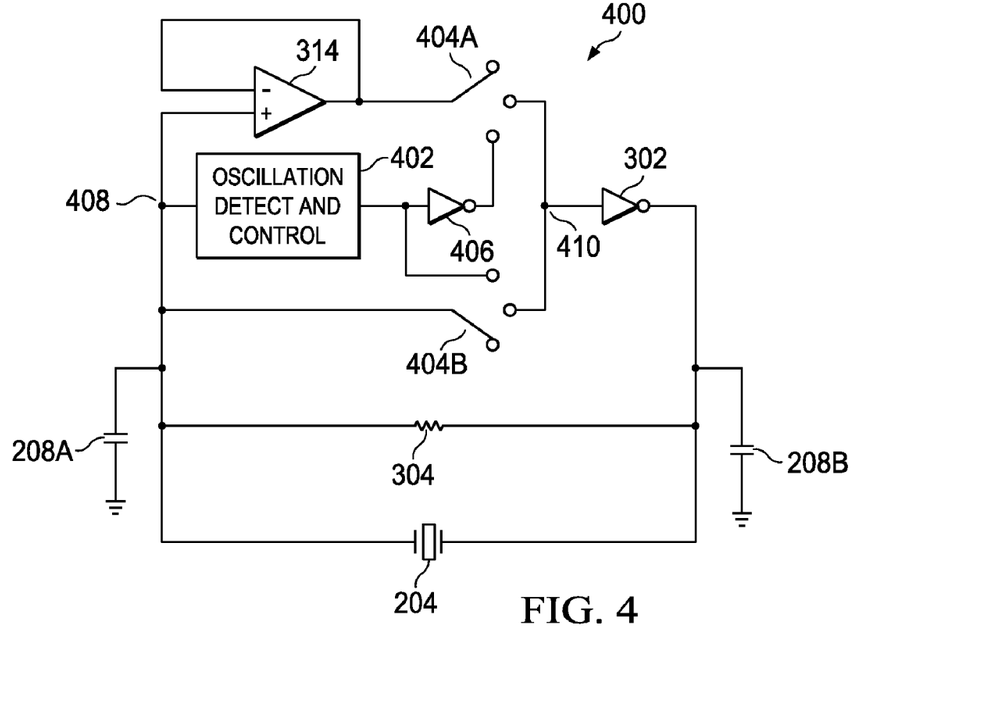
FIG. 4 depicts a circuit diagram of an exemplary fast start-up crystal oscillator according to some embodiments.

FIG. 4 depicts a circuit diagram of an exemplary crystal oscillator according to some embodiments of the claimed invention. In this embodiment, the crystal oscillator 400 includes an oscillation detection and control circuit 402, which is coupled between the crystal 204 and switches 404A and 404B. Based on a detected oscillation signal value, the oscillation detection and control circuit 402 (hereafter referred to as the control circuit 402) generates an enable signal that controls the switches 404A and 404B. The two switches 404A and 404B either connect the unity gain buffer 314 at the input of the inverting amplifier 302 or disconnect and disable it. During the oscillator's start-up phase, the unity gain buffer 314 is required; but after the oscillation signal reaches a threshold value, the unity gain buffer 314 can be disconnected from the oscillator circuit. One reason to disconnect the unity gain buffer 314 (when the oscillation signal reaches the threshold value) is to reduce power consumption of the circuit. The unity gain buffer 314 is an active device and it consumes power to operate. As a result, removing the unity gain buffer 314 from the circuit helps reduce power consumption. The period during which the unity gain buffer 314 is connected to the oscillator is called a boost state; alternately, the period during which the unity gain buffer 314 is disconnected from the crystal oscillator is called a normal state.

The switches 404A and 404B are controlled by the enable signal generated by the control circuit 402. Further, an inverter 406 inverts the enable signal to produce a complimentary enable signal, which is provided to the switch 404A. The enable signal is provided to the switch 404B. During the boost state, the enable signal is zero, which closes the switch 404A (complimentary enable signal is one) and opens the switch 404B. In the normal state, the enable signal becomes one, which opens the switch 404A (complimentary enable signal is zero) and closes the switch 404B, thereby disconnecting the unity gain buffer 314. In another embodiment, tri-state buffers or transmission gates can be employed instead of the switches. Operation of the control circuit 402 along with generation of the enable signal can be explained in detail with reference to FIG. 5.

Figure 5:
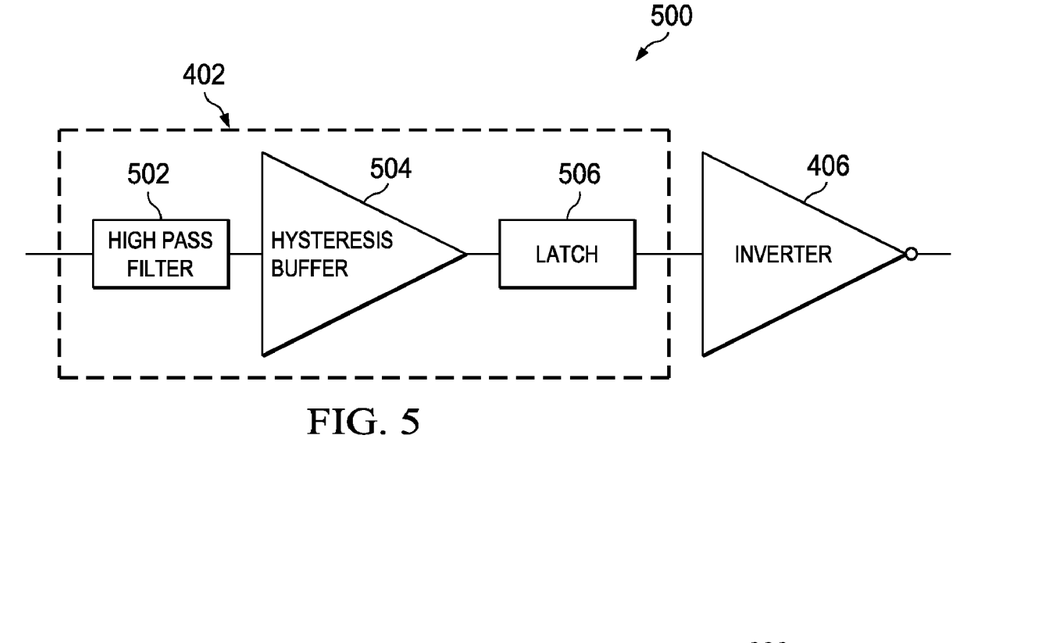
FIG. 5 depicts a block diagram of an exemplary oscillation detection and control circuit.

FIG. 5 illustrates a block diagram 500 of the control circuit 402 including a high-pass filter 502, a hysteresis buffer 504, and a latch 506. The high-pass filter 502 attenuates low-frequency noise from the signal and provides the high-frequency oscillation signal to the hysteresis buffer 504. Any high pass filter known in the art can be utilized, such as an RC filter, and RL filter, or an active device filter. In one implementation, selection of the high-pass filter characteristics (such as cut-off frequency, range of allowable frequencies, etc.,) depends on the crystal's resonant frequency or the required clock frequency.

A hysteresis buffer produces a two level output by providing a constant low output until an input signal crosses a threshold value, after which it provides a constant high value. i.e., the hysteresis buffer 504 switches its digital value (from low to high) when an input signal is higher than a certain selected threshold value. When the input is lower than another (lower) selected threshold value, the hysteresis buffer 504 switches back (high to low) to the constant low output. When the input is between the two threshold values, the hysteresis buffer 504 retains its digital value. This dual threshold action is generally termed hysteresis, which implies that the buffer has some memory. The hysteresis buffer 504 switches from one digital value to another when the oscillation signal crosses a selected threshold value. In one implementation, when the amplitude of the oscillation signal crosses a threshold value, the hysteresis buffer 504 switches its digital value from low to high. For example, the threshold value can be 80% of the power supply amplitude. In another implementation, the hysteresis buffer 504 switches when the oscillation signal duty-cycle crosses a threshold duty-cycle value. For example, the threshold duty cycle can be 40-45%.

A number of devices can be exploited to realize the hysteresis buffer 504; for example, a Schmitt trigger can be utilized. When the input to the Schmitt trigger is higher than a certain selected threshold, the output is high; when the input is below another lower chosen threshold, the output is low; when the input is between the two thresholds, the output retains its value. In another embodiment, a comparator is utilized instead of the hysteresis buffer 504. A comparator switches its output signal by comparing the oscillation signal with a threshold signal.

As the oscillation signal is a sinusoidal signal, its amplitude varies with time. Consequently, when the amplitude of the oscillation signal decreases, the hysteresis buffer 504 switches back (high to low), but in the consecutive period, the sine wave again increases to a maximum value, which can switch (low to high) the output of the hysteresis buffer 504 once more. This frequent switching can cause the switch 404A to switch on and off at the rate of the oscillation signal, which can cause disturbances in the functioning of the crystal oscillator 400. To overcome this problem, the output (high or low signal) of the hysteresis buffer 504 is supplied to the latch 506. After the hysteresis buffer 504 switches its digital value the first time (from low to high), the latch stores this value, and any subsequent switching does not affect the value of the latch.

In one implementation, the output of the latch 506 is the enable signal, which is provided to the switch 404B. The inverter 406 can invert the enable signal, and the output of the inverter 406 is provided to the switch 404A. Thus, when the enable signal is zero, the switch 404A is closed (complimentary enable signal is one) and the unity gain buffer 314 is connected to the oscillator circuit, isolating the inverting amplifier. When the enable signal is one, the switch 404B is closed, while the switch 404A is opened (complimentary enable signal is zero). In this state, the unity gain buffer 314 is disconnected from the input of the inverting amplifier.

When the oscillation signal exceeds the threshold value, the hysteresis buffer 504 switches, the latch 506 stores the switched value and provides this value to the switches 404A and 404B. The switch 404A is disabled, which disconnects the unity gain buffer 314 from the crystal oscillator circuit.

Different techniques can be employed to ascertain the threshold value of the oscillation signal. In one implementation, a voltage corresponding to approximately 80% of the power supply voltage is considered as the threshold value. In another implementation, when the oscillation signal starts building, it has a very low duty cycle; as the oscillation signal begins to reach its maximum value, the duty cycle of the oscillation signal begins to build as well. At the maximum value of the oscillation signal, the duty cycle becomes 50%. A duty cycle value between 40-45% can be considered as a threshold value to disconnect the unity gain buffer. It will be understood that the threshold value can vary for different techniques, and any technique can be employed to derive a threshold value without departing from the scope of the invention.

In one implementation, the control circuit 402 receives a boost signal. If the boost signal is low, the crystal oscillator 400 functions in the normal state, and the unity gain buffer 314 is disconnected, even for start-up. If the boost signal is high, the crystal oscillator 400 functions in the boost state during start-up, and the unity gain buffer 314 is connected. Once the oscillation signal crosses the threshold value, the unity gain buffer 314 is disconnected and the crystal oscillator 400 operates in the normal mode.

Exemplary Methods

Figure 6:
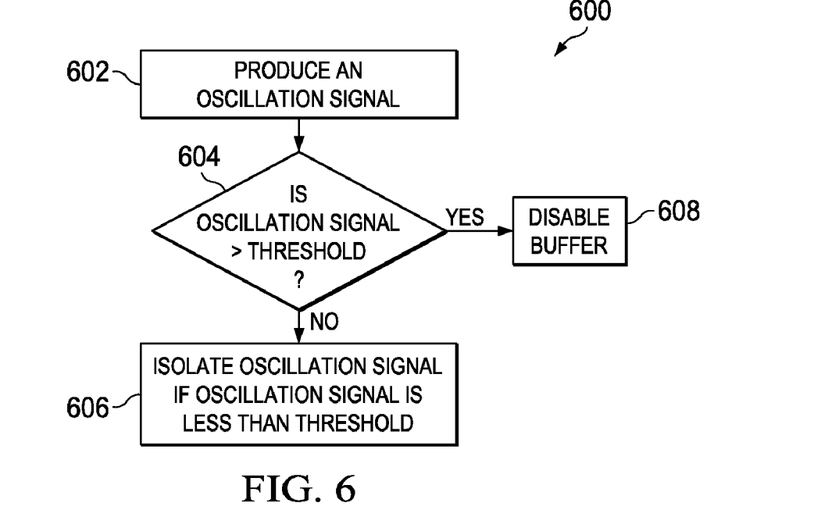
FIG. 6 is an exemplary method for reducing the start-up time of oscillations in a crystal oscillator.

FIG. 6 illustrates an exemplary method 600 for reducing the start-up time in a crystal oscillator. The method 600 includes the steps of producing an oscillation signal at a gain stage, determining whether the oscillation signal exceeds a threshold value, isolating the gain stage if the oscillation signal is less than the threshold, and amplifying the oscillation signal until a second threshold value. The exemplary method 600 will be described with reference to FIG. 1-5.

At step 602, an oscillation signal is produced. In one implementation, the exemplary crystal oscillator 300 produces the oscillation signal. Typically, the gain stage 202 includes free electrons and holes. When a power supply is applied to the gain stage 202, these electrons and holes start moving towards the junction barrier, producing a low voltage noise signal. The gain stage 202 amplifies this signal and forwards the amplified signal to the crystal 204, which behaves as a notch filter with a very high quality factor Q, only passing the signals at the resonant frequency and attenuating all others. This signal is then fed back to the gain stage 202 where it is amplified again, and the process repeats itself until the oscillation signal reaches a second threshold value. In one implementation, the second threshold value of the oscillation signal corresponds to the power supply voltage. In another implementation, the second threshold value can be any value set by the manufacturers.

Referring now to step 604, a determination is made whether the oscillation signal exceeds a first threshold value. In one implementation, the control circuit 402 makes this determination by comparing the oscillation signal value with a predetermined threshold value. If the oscillation signal is lower than the first threshold value, the method proceeds to step 606 (no path from step 604), else the method proceeds to step 608 (yes path from step 604).

At step 606, the gain stage 202 is isolated from a shunt capacitance in the oscillator circuit. In one implementation, a buffer stage 210 isolates the gain stage 202 from the shunt capacitance of the crystal 204. The buffer stage 210 has very high input impedance and very low output impedance, which prevents the shunt capacitance from loading the gain stage 202. Since, the loading effects of the shunt capacitance are removed, the negative resistance of the gain stage 202 increases, which in turn increases the rate of growth of the oscillation signal (as seen in equation 1). A higher rate of growth of the oscillation signal ensures that the oscillation signal reach stabilization sooner, thereby decreasing the startup time of the crystal oscillator. The buffer stage 210 can be realized using any buffer device known in the art with very high input impedance and very low output impedance, such as a unity gain buffer, a common-drain circuit, and an n-gain buffer.

The oscillation signal crosses the first threshold value at step 608. At this stage, the equivalent capacitance of the crystal oscillator is no longer isolated from the input of the inverting amplifier 302. The switches 404A and 404B disconnect the buffer stage 210 from the input of the gain stage 202. In one implementation, the oscillation detection and control circuit 402 provides an enable signal to the switches 404A and 404B, in order to disconnect the buffer stage 210. One reason to disconnect the buffer stage 210 is to reduce power consumption in the oscillator circuit. The buffer stage 210 is an active device, which utilizes considerable power, therefore, disconnecting the buffer stage 210 after the boost stage ensures that power consumption is kept to a minimum.

Figure 7:
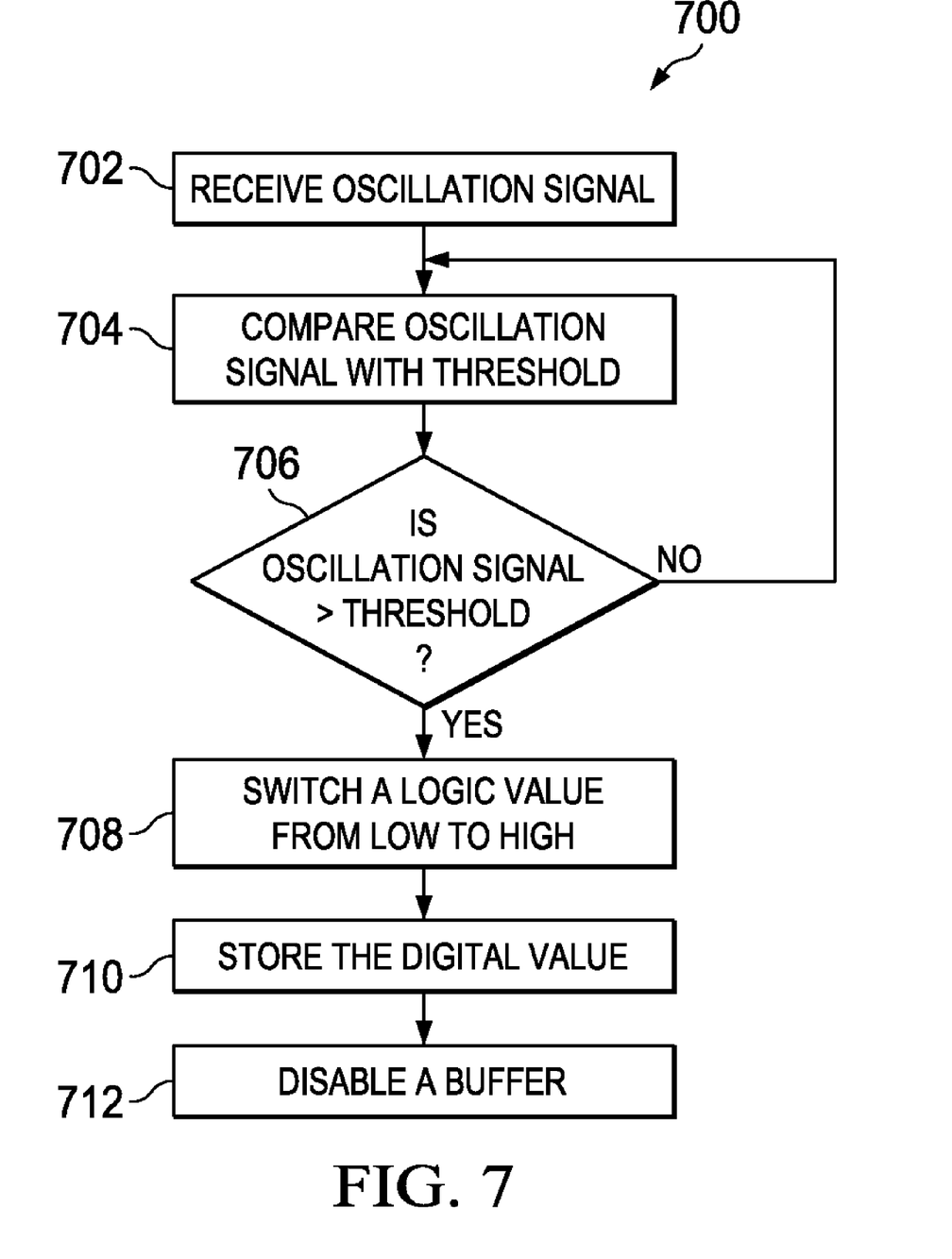
FIG. 7 is an exemplary method to detect an oscillation signal and control a buffer stage based on the detected oscillation signal.

FIG. 7 illustrates an exemplary method 700 to detect an oscillation signal and control a buffer stage based on the detected oscillation signal. The method 700 includes the steps of receiving an oscillation signal, comparing the oscillation signal with a threshold value, switching a logic value if the oscillation signal crosses the threshold value, latching the logic value, and producing an enable signal.

At step 702, an oscillation signal is received. In one implementation, the control circuit 402 receives the oscillation signal. The high pass filter 502 filters the oscillation signal to remove all low frequency noise signals.

Proceeding to step 704, the method compares the oscillation signal with a threshold signal. In one implementation, the hysteresis buffer 504 carries out the comparison. For example, a Schmitt trigger (a hysteresis buffer type) compares the oscillation signal value with a predefined threshold value. Any hysteresis buffer can be employed instead of the Schmitt trigger as long as it follows the principles of a hysteresis buffer, which are well known in the art. In another example, a comparator switches its output by comparing two input signals, one of which is the threshold signal and the other is the oscillation signal.

At step 706, the method 700 determines whether the oscillation signal exceeds the threshold signal. If the oscillation signal exceeds the threshold signal (yes path from step 706), the method proceeds to step 708, else (no path from step 706) the method returns to step 704.

At step 708, when the oscillation signal exceeds the threshold signal, the hysteresis buffer 504 switches its digital value from low to high. In one implementation, a comparator switches its output state instead of the hysteresis buffer 504.

The switched digital value of the hysteresis buffer 504 is stored at step 710. In one embodiment, the switched digital value is stored in a latch, such as latch 506. The latch 506 holds the switched digital value until the crystal oscillator is switched off. In another implementation, the latch 506 holds the switched value until the hysteresis buffer 504 switches again; the latch 506 then stores the new switched value. Further, the latch 506 can hold the switched digital value that the hysteresis buffer 504 produces the first time and it can remain unaffected for any subsequent switching.

At step 712, the method generates an enable signal. In one implementation, the latch 506 output is the stored digital value. This output can be an enable signal, which the latch 506 provides to the switches 404A and 404B. In one implementation, the inverter 406 inverts the enable signal, producing a complimentary enable signal, which is provided to the switch 404A. The enable signal disconnects the buffer stage 210 from input of the gain stage 202.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions.

In addition, the order in which the methods are described is not intended to be construed as a limitation, and any number of the described method steps can be combined in any order to implement the methods, or alternate methods. Additionally, individual steps may be deleted from the methods without departing from the spirit and scope of the subject matter described herein. Furthermore, the methods can be implemented in any suitable hardware, software, firmware, or combination thereof, without departing from the scope of the claimed invention.

What is claimed is:

1. A fast start-up crystal oscillator comprising:
   a gain stage with negative resistance;
   a crystal in a feedback loop of the gain stage, the crystal including a shunt capacitance; and
   a buffer operatively coupled to an input of the gain stage to isolate the gain stage from the shunt capacitance and to effectively increase the negative resistance of the gain stage, wherein the buffer operative for facilitating fast start-up and is selectively disabled when a threshold is reached;
   an oscillation detection and control circuit for decoupling the buffer in response to an amplitude of an oscillation signal exceeding a threshold value;
   a biasing resistor coupled in parallel with the gain stage for biasing the gain stage; and
   at least one load capacitor,
   wherein the oscillation detection and control circuit comprises:
      a high-pass filter;
      a hysteresis buffer operatively coupled to an output of the high-pass filter, the hysteresis buffer switches a digital value in response to the amplitude of the oscillation signal; and
      a latch operatively coupled to an output of the hysteresis buffer, the latch generates an enable signal in response to the digital value.

2. The fast start-up crystal oscillator of claim 1, wherein the hysteresis buffer is one of a Schmitt trigger or a comparator.

3. The fast start-up crystal oscillator of claim 1, wherein the gain stage and the high-pass filter are provided a current source power supply.

4. The fast start-up crystal oscillator of claim 1, further comprises an inverter operatively coupled to an output of the oscillation detection and control circuit, the inverter produces a complimentary enable signal in response to the enable signal.

5. The fast start-up crystal oscillator of claim 4, wherein the crystal oscillator operates in a boost mode during start-up and a normal mode thereafter, wherein the enable signal is low in the boost mode and high in the normal mode.

6. The fast start-up crystal oscillator of claim 5, further comprising:
   a first switch coupled to the output of the oscillation detection and control circuit, wherein the switch disables and removes the buffer from the feedback loop in the normal mode; and
   a second switch coupled to an output of the inverter, wherein the switch operatively couples the buffer to the input of the gain stage in the boost mode.

7. The fast start-up crystal oscillator of claim 6, wherein the oscillation detection and control circuit is connected between the crystal and the first and second switches.

8. The fast start-up crystal oscillator of claim 1, wherein the gain stage is an inverting operational amplifier.

9. The fast start-up crystal oscillator of claim 8, wherein an input of the buffer is coupled to the crystal and an output of the buffer is coupled to an inverting input of the inverting operational amplifier.

10. The fast start-up crystal oscillator of claim 1, wherein the buffer is one of a unity gain buffer or an n-gain buffer.

11. The fast start-up crystal oscillator of claim 1, wherein the buffer sufficiently increases the negative resistance of the gain stage thereby reducing the start-up time of the crystal oscillator and producing sustained oscillations.

12. A fast start-up crystal oscillator comprising:
    an inverting amplifier with negative resistance;
    a biasing resistor coupled in parallel with the inverting amplifier;

a crystal operatively coupled in a feedback loop of the inverting amplifier, the crystal includes a shunt capacitance; and a unity gain buffer coupled to an input of the inverting amplifier, the unity gain buffer isolates the input of the inverting amplifier from the shunt capacitance and effectively increases the negative resistance of the inverting amplifier, wherein the unity gain buffer is operative for facilitating fast start-up and is selectively disabled when a threshold is reached;

an oscillation detection and control circuit coupled between the crystal and the inverting amplifier, wherein the oscillation detection and control circuit disables the unity gain buffer in response to an oscillation signal crossing a first threshold value, wherein the oscillation detection and control circuit comprising:
  a high pass filter;
  a Schmitt trigger operatively coupled to the output of the high-pass filter, the Schmitt trigger switches a digital value in response to an amplitude of the oscillation input signal; and
  a latch operatively coupled to the output of the Schmitt trigger, the latch generates an enable signal in response to the digital value.

13. The fast start-up crystal oscillator of claim 12 further comprising:

an inverter coupled to an output of the latch and producing an inverted enable signal;

a first switch coupled to an output of the inverter, the switch operatively couples the unity gain buffer to the input of the inverting amplifier in response to a high inverted enable signal; and a second switch operatively coupled to the output of the latch, the second switch disables and removes the unity gain buffer from the input of the inverting amplifier in response to a high enable signal.

14. A method for reducing start-up time of a crystal oscillator, the method comprising:

producing an oscillation signal at a gain stage;

comparing an amplitude of the oscillation signal with a first threshold value; and isolating the gain stage from impedance produced by a shunt capacitance in the crystal oscillator in response to the amplitude of the oscillation signal being less than the first threshold value, wherein isolating the oscillation signal comprises:
  receiving the oscillation signal;
  comparing the amplitude of the oscillation signal with the first threshold value;
  switching a digital value upon the amplitude of oscillation exceeding the threshold value;
  storing the switched digital value; and
  disabling a buffer stage based on the stored digital value.

* * * * *